United States Patent [19]

Petersen et al.

[11] Patent Number: 4,859,189
[45] Date of Patent: Aug. 22, 1989

[54] MULTIPURPOSE SOCKET

[75] Inventors: Kurt H. Petersen; Christopher A. Schmolze, both of Austin, Tex.

[73] Assignee: Minnesota Mining and Manufacturing Company, St. Paul, Minn.

[21] Appl. No.: 217,212

[22] Filed: Jul. 8, 1988

Related U.S. Application Data

[63] Continuation-in-part of Ser. No. 101,203, Sep. 25, 1987, abandoned.

[51] Int. Cl.⁴ .............................................. H05K 1/00
[52] U.S. Cl. ..................................... 439/66; 439/67; 439/493; 439/71; 361/398
[58] Field of Search ................................... 439/65–69, 439/71–73, 77, 86, 91, 493, 498, 499; 361/398

[56] References Cited

U.S. PATENT DOCUMENTS

| | | | |
|---|---|---|---|
| 3,832,769 | 9/1974 | Olyphant, Jr. et al. | 29/626 |
| 3,868,724 | 2/1975 | Perrino | 357/65 |
| 4,012,117 | 3/1977 | Zazzery | 439/68 |
| 4,130,327 | 12/1978 | Spaulding | 339/17 |
| 4,169,642 | 10/1979 | Mouissie | 439/67 |
| 4,506,938 | 3/1985 | Madden | 439/71 |
| 4,548,862 | 10/1985 | Hartman | 428/323 |
| 4,597,617 | 7/1986 | Enochs | 439/66 |
| 4,601,525 | 7/1986 | Kandybowski | 439/68 |
| 4,621,884 | 11/1986 | Berkebile, Jr. et al. | 439/68 |
| 4,658,331 | 4/1987 | Berg | 439/66 |

FOREIGN PATENT DOCUMENTS 0231518 2/1984 Japan ..................................... 439/66

OTHER PUBLICATIONS

"Film Carrier . . . Chips", Technical Articles, Stephen E. Grossman, May 16, 1974, pp. 89–90.

Primary Examiner—David Pirlot
Attorney, Agent, or Firm—Donald M. Sell; Walter N. Kirn; John C. Barnes

[57] ABSTRACT

A test socket for testing chips and chips on tape wherein the test socket is formed on a heat resistant dielectric film having contact pads and connector pads joined by metallic circuit traces and which film is wrapped on a compliant pad. The connector end of the tape is joined to a circuit board by a conductive tape and maintained in contact by the compliant pad. A frame registers the chip with the contact area of the tape.

9 Claims, 3 Drawing Sheets

MULTIPURPOSE SOCKET

RELATED APPLICATIONS

This application is a continuation-in-part of application Ser. No. 101,203 filed Sept. 25, 1987 now abandoned.

BACKGROUND OF THE INVENTION

1. Field of the Invention

This invention relates to an improvement in devices for electrically testing high performance integrated circuit devices or chips, and in one aspect to an improved test socket for supporting the chip, whether on tape or not, free of detrimental effect on the device or tape and affording rapid facile positive electrical connection with the contact points of said device.

2. Description of the Prior Art

As the development of integrated circuit devices continues, i.e. "chips", to provide in a single chip more and more capability, they result in more, and more, and more closely spaced contact points for electrically connecting circuits to a chip. It is always a step in the manufacture to test the chips. Performance of a chip is tested by placing each chip in a test fixture or test socket and connecting all of the contact points electrically to the test fixture such that a series of tests may be run on each of the modes of operation to determine the quality of the chip. As the contact points become located closer and closer together it has become increasingly difficult to design a test socket which has hard wired contacts close enough together to assure contact with the individual contact points of the chip, and such test sockets are not suitable for testing integrated circuit devices packaged on a tape. Examples of such test sockets are present in U.S. Pat. Nos. 3,551,878; 3,914,007; 4,130,327; 4,508,403; 4,541,676; and application Ser. No. 643,237, filed Aug. 22, 1984, and assigned to the assignee of this application. Thus, with the development of technologies for chip-on-tape manufacture it was necessary to also be able to test the chips on the tape requiring registration with and surface contact to each of the contact points of such chips. To do this requires high density terminals in the test socket which were not easily afforded by the mechanical fixturing of the test sockets. The requirements for chip-on-tape testing of chips having high density contact points required the carrier tape handling capability, a hot test capability, an intelligent operator interface, quick load and unload of tape and flexibility as to the set up for different chip-on-tape formats.

The present invention provides a manual tape test station having strip or tape handling capability or individual chip handling capability, hot test capability, an intelligent operator interface which provides for the location of the chip, quick load and unload of the chip and adapted for change from one chip format to another.

SUMMARY OF THE INVENTION

The present invention provides a temporary electronic circuit socket connector which can be utilized to effectively connect integrated circuit devices or chips, which are carried on a tape during manufacture, to a circuit and which may be for the purpose of testing the device or chip. The connector is suitable as a test fixture for chips and comprises a single metal layer beam tape which has been etched to define contact area portions and connector area portions joined by circuit traces.

Preferably contact pads are formed on one surface of a dielectric backing, and conductive columns extend therethrough to circuit traces formed from a conductive metal coating on the opposite surface. The pads are crowns formed in the contact area to insure good contact to the contact points of the chip. The contact pads in the contact portion of the beam tape are connected by the circuit traces to the connector pads in the connector portion. The beam tape is bent to dispose the contact portion and the connector portions in vertically spaced relation with each of the same being outwardly exposed and the circuit traces being positioned inwardly. A compliant elastomer pad is disposed about a locating brace in a frame member and between the contact portion and the connector portion. The frame member which is adapted to be precisely located on the surface of a circuit board forming the test device or at least a portion thereof. The frame member is then fixed to the circuit board by suitable fastening elements. Alignment means on the frame member afford registration of the frame member with the printed circuit board and with the beam tape whereby the connector pads of the tape are properly aligned with pads on the circuit board and sections of the tape carrying the chip are properly aligned over the contact portions of the beam tape. A cover member supported on the frame affords means for temporarily pressing the chip-on-tape segment or chip against the contact portion of the beam tape against the resilience of the elastomer pad. This pressure member may be latched in place for continuous contact by a readily releasable latch means. The pad between the locating brace and the printed circuit board presses the connector pads against contacts on the printed circuit board to maintain contact during the burn-in and or testing. Thus the socket, beam tape and elastomer pad may be readily changed for testing other chip formats utilizing the same printed circuit board.

Alternatively, the connector portion of the beam tape is adhered in registration with the contacts of a printed circuit board by the use of a double sided pressure-sensitive adhesive coated electrically conductive tape which is conductive only transversely through the tape and affords the electrical connection between the connector pads on the beam tape and the opposed contacts on the printed circuit board. The frame member is also fastened to the printed circuit board to maintain it stable for chip changes. Separate housings, registrable with the printed circuit board, may be used with other beam tapes, but the adhesive should be removed as the sockets are changed.

BRIEF DESCRIPTION OF THE DRAWING

The present invention will be further described with reference to the accompanying drawing wherein.

DETAILED DESCRIPTION OF THE INVENTION

Figure 1:
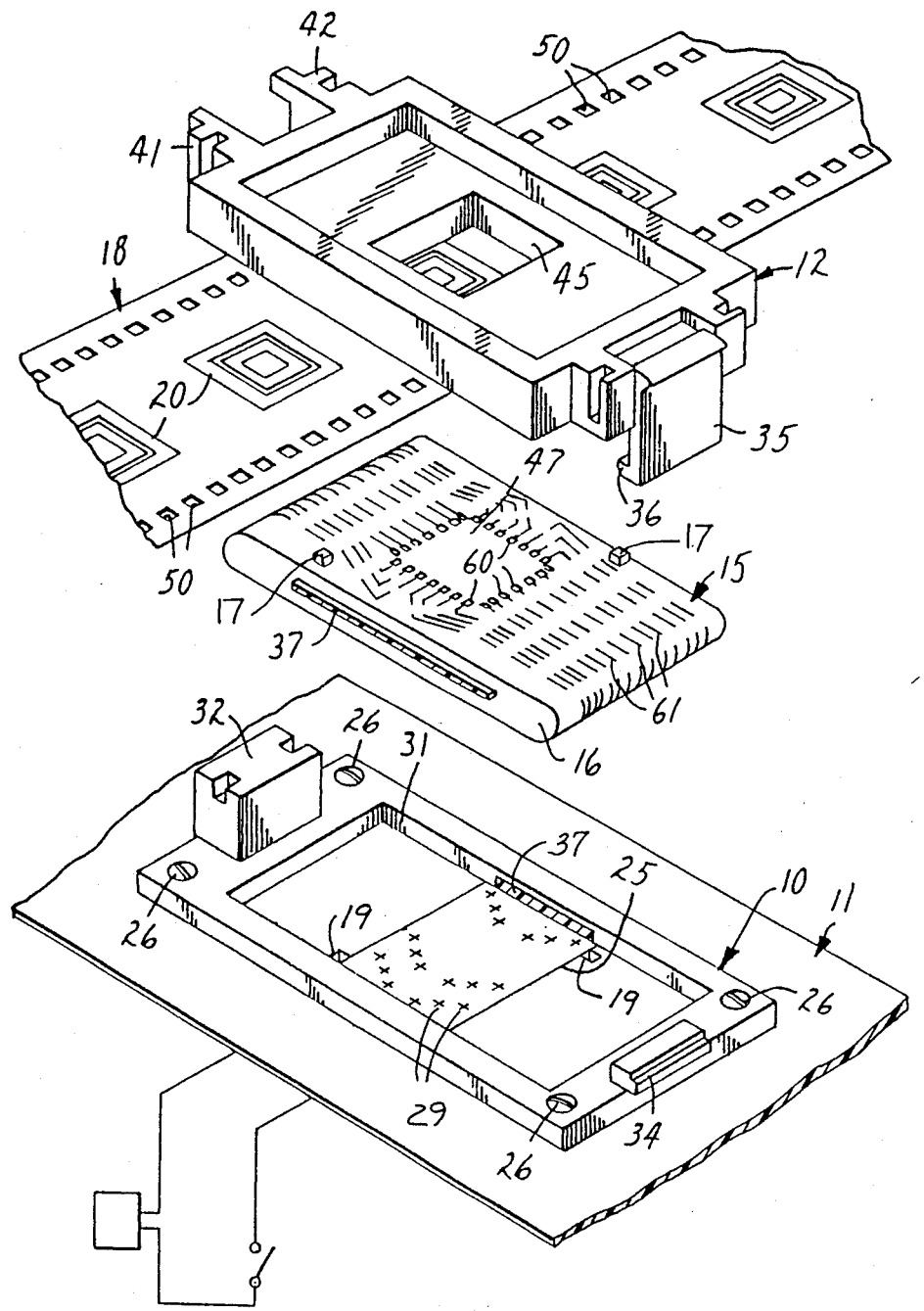
FIG. 1 is an exploded view of the chip test socket formed according to the present invention.

Referring to FIG. 1, the test socket of the present invention consists of a frame member having a base 10 adapted for alignment on a printed circuit board 11. A cover plate 12 is hinged to the base 10. A flexible circuit member comprising a strip of beam tape 15 is folded about an elastomeric pad 16 and a locating brace 37. The brace 37 is provided with alignment means in the form of pins 17 supported to position and register both the beam tape 15 and a strip of flexible tape 18, the tape 18 supports, in spaced relation therealong, a series of high performance integrated circuit devices or chips 20. Alignment between the connector portions of the beam tape 15 and contacts 29 on the printed circuit board is also provided by the pins 17 and maintained by fasteners, such as bolts 26 to locate the connector portions 63 of the beam tape 15 with the contacts 29 on the printed circuit board 11 and to urge the contact points on the beam tape into electrical contact with the contacts on the printed circuit board.

Figure 4:
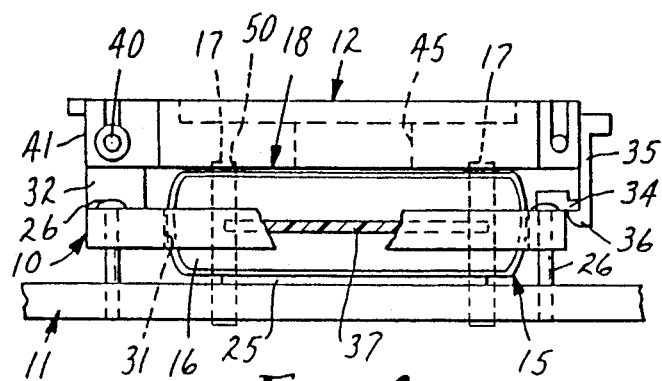
FIG. 4 is a side view of the chip test socket.

The base 10 is generally rectangular in shape and is formed with a centrally located rectangular opening 31. At one end is a pillar 32 which serves as a hinge support for the cover 12. Opposite the pillar 32 is a projection 34 which cooperates with a spring biased latch member 35 supported on the cover 12 and pivoted thereto but biased by a torsion spring into latching engagement with the projection 34 such that the projection 34 will engage a recess 36 which extends transversely of the latch member 35 as shown in FIGS. 1 and 4. The base has a locating brace 37 which extends across the opening 31 and is joined to the side members of the base forming the opening 31. The brace 37 supports the pins 17 and the resilient material 16 supporting the beam tape 15.

The cover 12, as mentioned, is pivoted on the pillar 32 by means of a pin 40 extending through legs 41 and 42 projecting parallelly from one end of the cover. The cover 12 is hinged by the pin 40 to move from an open position to a closed position mating closely with the base to urge the beam tape and the contacts of a chip, whether on tape or on a carrier, into contact with each other. Positioned generally centrally of the cover 12 is an opening 45 to avoid pressure directly to a chip. Registration is made between a beam tape of 15 and the contact portions of the tape 18 as the cover is closed. This alignment and registration is afforded by alignment or positioning means such as the square pins 17 which are provided on the base 10 and fit in the edge sprocket holes 50 of the tape 18. Alternatively, a chip carrier may be registered on the pins 17 to locate a chip on the beam tape 15. The tape 18 is formed according to U.S. Pat. No. 3,832,769, issued Sept. 3, 1974 and incorporated by reference.

Figure 2:
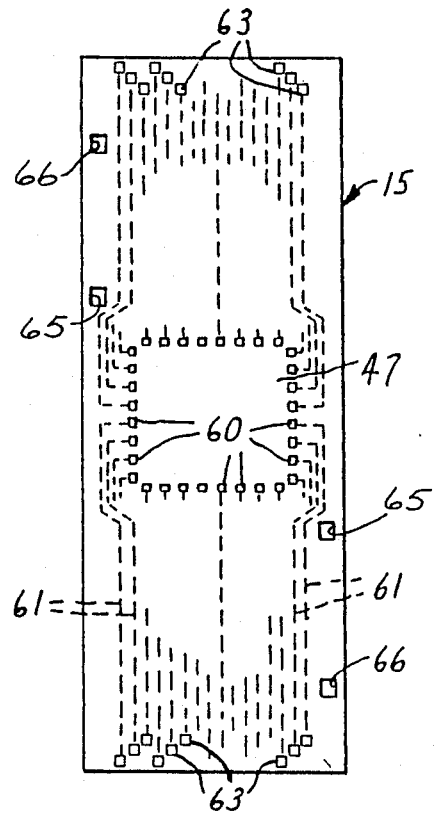
FIG. 2 is a plan view of a strip of the beam tape.
Figure 3:
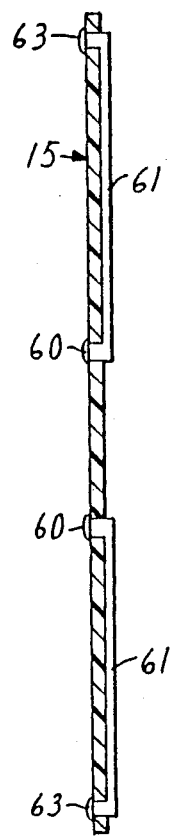
FIG. 3 is a schematic sectional view of the beam tape.

The beam tape 15, as illustrated in FIGS. 1, 2, and 3 comprises a contact portion and a connector portion. As illustrated in FIGS. 2 and 3, the contact portion 47 of the tape 15 is generally centrally located with respect to the illustrated strip and comprises a plurality of contacts 60 which form in the illustrated embodiment a generally rectangular outline with a plurality of the contacts 60 in each of four rows thereof about the center of the strip. These contact portions 60 are joined by conductive material in holes through the tape to circuit traces 61 which electrically conductively join the contacts 60 to connector pads 63 in the connector portion of the tape strip. The connector pads 63 are similarly formed by conductive columns which extend through the backing and connect to the conductive circuit traces 61. Alignment of the connector portion and pads 63 with the contacts in the printed circuit board 11 is afforded by alignment pins 17 which pass through registration holes 65 positioned adjacent to the contact area of the tape 15 and registration holes 66 positioned through the tape adjacent the connector area of the tape. Tape 15 is a polyamide film backing having a conductive metal coating on one surface. Then by etching or masking processes the contact areas and circuit traces are formed on the surface of the tape. A preferred backing for the tape 15 is Kapton TM polyamide "H" film available from Du Pont. As indicated in FIGS. 3 and 4, the contacts 60 in the contact portion of the tape are slightly embossed from the surface of the tape to provide a hump in the tape at the area of the contact. This humped contact at one end of each circuit trace provides the tape contact and may have a further metal coating on the surface thereof.

When the tape 15 is formed it is wrapped around an elastomeric support pad 16, e.g. a silicone rubber pad as shown in FIG. 1, positioned about the brace 37 which, as shown for illustration is out of the opening 31 across which it is positioned. The compliant nature of the pad 16 provides a support for the tape material 15 such that contact is maintained between the contacts 60 and the contact points of the chip 20 or a single chip which may be unsupported by the tape and positioned in a plate set on the pins 17 having an aperture to receive the chip such that the cover 12, when closed will maintain contact between said chip and the opposed crowns.

In this test socket there are no formed or stamped metal contacts or pins between the printed circuit board and the contact points of the chip. The photographically patterned contact areas, circuit traces and connector areas of the beam tape 15 form the circuit path from the chip to the circuit board of the test equipment. The elastomeric pad 16 provides the continued energy necessary to maintain reliable connections with all of the contact points. It is maintained under compression with the printed circuit board by the fasteners 26. When the cover 12 is latched in the mating position against the base 10 contact is maintained between the chip and contact pads 60 by the pad 16 for reliable connection during the test cycles.

Figure 5:
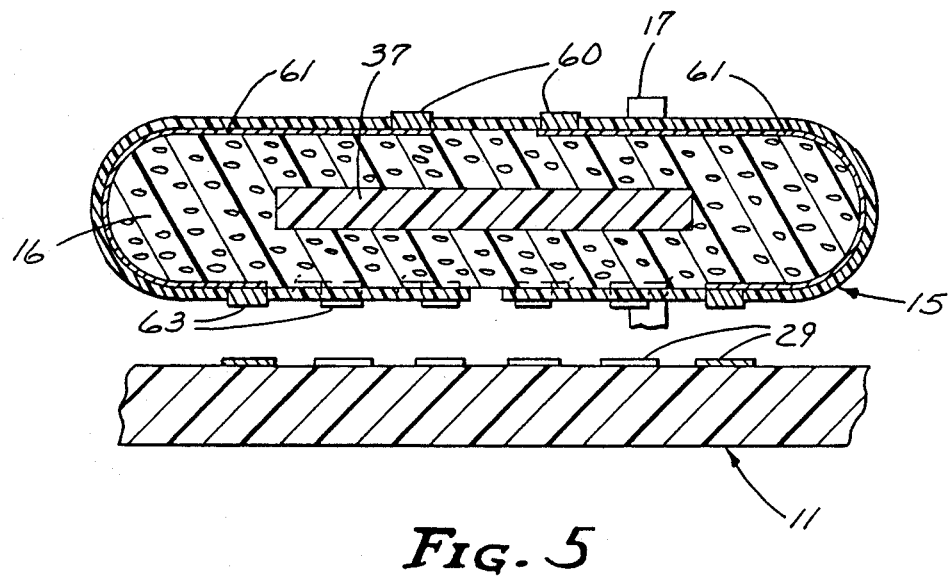
FIG. 5 is an enlarged illustrative sectional view showing the relationship of the printed circuit board and the connecting beam tape.

Typically chips to be tested afford 1 to $1 < X > \infty$ contact points 60 about the center of the contact portion of the tape 15 to which then are connected to 1 to $1 < X > \infty$ connector points for connection to the printed circuit board. When the connector end portions of the tape, as illustrated in FIG. 2, are folded about opposed ends of the pad 16, as illustrated in FIGS. 4 and 5, the pins 17 align the contact points with the base 10 and align the connector pads with the base. The pins 17 on the brace 37 fit into holes 19 formed in the printed circuit board 11 outside the area of the contacts 29 to then align the tape 15 and connector pads to the contacts 29. The abutting ends of the tape 15 and the connector pads and the contacts 29 can be maintained in position by the use of a conductive adhesive tape 25 positioned against the exposed connector pads 63. The tape 25 is a layer of pressure sensitive adhesive which is formed to be conductive by conductive particles being disposed in the layer of adhesive as disclosed in U.S. Pat. No. 4,606,962, issued Aug. 19, 1986, and incorporated herein by reference. This adhesive tape is conductive only in a path between the opposite surfaces and thus this tape will join the connectors 63 to the contacts on the printed circuit board 11. An example of such conductive tape is C 3100X and C 4100X available from Minnesota Mining and Manufacturing Company of St. Paul, Minn. Alignment, as above noted, is established by the alignment or locating pins 17 fitting in the printed circuit board and holes 65 and 66 in the tape 15.

Alignment of the chips is maintained through the pins 17, and when the cover 12 is opened, the chip is advanced by moving the tape 18 forward to register openings 50 along the marginal edges on pins 17 to locate a second chip aligned with the contacts of the beam tape 15. The cover is then swung to the closed position and the latch plate 35 engages the projection 34. There is compression on the pad 16 amounting to 17 to 29 grams per contact in the illustrated socket. The registration is thus established and the chip is located in the opening. The tape 15 is registered by the pins 17 passing through the holes 65 and 66, and contact is made with the printed circuit board contacts through the tape 25 on the Z-axis and compressed pad 16 under the force of the fasteners 26, or solely through the compressive contact between the pads 63 and the contacts 29.

This system affords reliability in testing, permits the circuit to be changed readily to match different formats for the chips, and the selections of tape permit testing over a wide range of elevated temperatures. Having thus described the present invention with respect to a preferred embodiment it will be appreciated that changes may be incorporated without departing from the scope or the spirit of this invention as described in the attached claims.

We claim:

1. A socket connector for use in test and burn-in of integrated circuit devices having contact points, said connector comprising:

a conductive metal layer beam tape having a central portion and end portions, said central portion of said beam tape defining a contact area having contact portions to contact the contact points of the integrated circuit device and a connector area at said end portions having spaced connector portions for connection to correspondingly spaced contacts on a circuit board, said beam tape having registration holes selectively positioned in relationship to said contact portions and said connector portions, and said beam tape being folded between said contact area and said connector area, a compliant elastomeric pad disposed between said contact area and said connector area for supporting said contact area and said connector area, frame means for supporting said pad and locating said connector area with said spaced connector portions positioned opposite to the contacts of a said printed circuit board and for locating an integrated circuit device to place the contact points on the contact portions of said contact area, said frame means including registration pins extending through said registraton holes, and means for pressing said integrated circuit device onto said contact area with the contact points engaging said contact portions against the resilient support of said elastomeric pad.

2. A socket connector according to claim 1 wherein a strip of tape having opposite surfaces, which is conductive through the tape between the surfaces, is applied over the connector area of said beam tape.

3. A socket connector according to claim 2 wherein said beam tape comprises a thin dielectric backing and on one surface a pattern of conductive strips defining circuit traces which strips are joined to individual crowns on the opposite surface of the tape defining said contact portions and connector portions.

4. A socket connector according to claim 1 wherein said frame means comprises a plate having a rectangular opening and a brace spanning said opening, said elastomeric pad being positioned about said brace to urge said connector area toward a said circuit board and said contact area, toward a said device.

5. A socket connector according to claim 4 wherein fastening means secure said frame means to a said printed circuit board with the elastomeric pad pressing said tape connector area toward said printed circuit board.

6. A socket connector according to claim 4 wherein said brace has pin means extending from opposite surfaces thereof and through said beam tape adjacent to said contact area and said connector area for registering said beam tape to said frame means.

7. A socket connector according to claim 5 wherein said pin means includes means for registering said frame means with a said circuit board for registering said connector area with a series of contacts formed on said circuit board.

8. A socket connector according to claim 7 wherein said means for pressing said integrated circuit device onto said contact area comprises a cover hinged to said base and formed to move from an open position to a closed mating position with said base to urge said beam tape contact area against said elastomeric pad for urging a said circuit device into intimate electrical contact therewith, and releasable latch means for holding said cover in said mating position.

9. A socket connector according to claim 8 wherein registration means afford alignment of a said circuit device with said contact area of said beam tape for making said electrical contact therewith.

* * * * *